(12) United States Patent
Lin et al.

(10) Patent No.: US 7,412,765 B2
(45) Date of Patent: Aug. 19, 2008

(54) METHOD OF MANUFACTURING A STICKER TYPE ANTENNA

(75) Inventors: Chun-Wei Lin, Pa-Te (TW); Tung-Liang Huang, Pa-Te (TW)

(73) Assignee: Auden Techno Corp., Tao-Yuan Hsien (TW)

( * ) Notice: Subject to any disclaimer, the term of this patent is extended or adjusted under 35 U.S.C. 154(b) by 104 days.

(21) Appl. No.: 11/486,310

(22) Filed: Jul. 14, 2006

(65) Prior Publication Data

US 2008/0010809 A1  Jan. 17, 2008

(51) Int. Cl.
H01P 11/00 (2006.01)
(52) U.S. Cl. .................... 29/600; 29/846; 343/700 MS; 340/572.1
(58) Field of Classification Search ............... 29/592.1, 29/593, 600, 601, 825, 829, 846; 343/700 MS, 343/790, 880, 895; 235/380, 487, 492; 340/572.1, 340/572.8; 400/621; 156/64
See application file for complete search history.

(56) References Cited

U.S. PATENT DOCUMENTS

| | | | |
|---|---|---|---|
| 5,752,204 A * | 5/1998 | Epperson et al. ......... 455/575.7 |
| 5,761,801 A * | 6/1998 | Gebhardt et al. ............... 29/846 |
| 6,121,880 A * | 9/2000 | Scott et al. ................ 340/572.5 |
| 6,407,669 B1 * | 6/2002 | Brown et al. ............. 340/572.1 |
| 6,421,013 B1 * | 7/2002 | Chung .................. 343/700 MS |
| 6,591,496 B2 * | 7/2003 | Koskenmaki et al. ......... 29/846 |
| 7,102,522 B2 * | 9/2006 | Kuhns ...................... 340/572.7 |

* cited by examiner

Primary Examiner—Minh Trinh
(74) Attorney, Agent, or Firm—Troxell Law Office, PLLC

(57) ABSTRACT

A method of manufacturing a sticker type antenna, in which a copper foil of 0.017 mm by thickness is stuck to a layer of releasable film in advance, in order that the copper foil can bear the pulling force in a brush electroplating process to thereby substitute the conventional beryllium copper of a larger thickness. The copper foil after brush electroplating undergoes punching and cutting for forming a pattern and is stuck to a semi-finished product of Mylar, hence the copper foil is stuck onto the back side of the Mylar layer; then the Mylar layer with the copper foil is separated from the releasable film, then the back side of the Mylar layer is applied with adhesive and again is stuck to the releasable film; after punching and cutting the Mylar layer for patterning and edging, a sticker type antenna is made.

5 Claims, 3 Drawing Sheets

A1. to draw a positioning hole on the Mylar layer and the releasable film

↓

A2. to form the positioning hole by punching and cutting to form the semi-finished product

METHOD OF MANUFACTURING A STICKER TYPE ANTENNA

BACKGROUND OF THE INVENTION

1. Field of the Invention

The present invention relates to a method of manufacturing a sticker type antenna, and especially to a method of manufacturing a sticker type antenna of a copper foil of 0.017 mm by thickness.

2. Description of the Prior Art

A sticker type antenna is convenient for being loaded in a minimized mobile phone or a mobile electronic device. Manufacturing of a conventional sticker type antenna uses beryllium copper of 0.1 mm by thickness, because only beryllium copper of such a thickness can bear the pulling force required in the subsequent brush electroplating process. By virtue that the price of beryllium copper is high, the cost of a sticker type antenna is high consequently, this is not good for competition.

And more, a sticker type antenna must be enveloped with a layer of Mylar (a kind of polyester film) for protection, however, the Mylar is only stuck to copper in the process of manufacturing, it happens sometimes in operation that the Mylar is separated from the copper; such a defect needs to be eliminated.

SUMMARY OF THE INVENTION

The present invention primarily is to provide a method of manufacturing a sticker type antenna, in which a copper foil of 0.017 mm by thickness is stuck to a layer of releasable film in advance, in order that the copper foil can bear the pulling force in the brush electroplating process to thereby substitute the conventional beryllium copper of 0.1 mm by thickness, and to largely reduce the cost of production, the antenna made is much thinner than an antenna of the same style.

After the copper foil of the present invention is stuck to the releasable film and processed by the brush electroplating process, the copper foil undergoes punching and cutting for forming a pattern and is stuck to a semi-finished product of Mylar, hence the copper foil is stuck onto the back side of the Mylar layer; then the Mylar layer with the copper foil is separated from the releasable film, then the back side of the Mylar layer is applied with adhesive and again is stuck to the releasable film; after punching and cutting for patterning and edging, a sticker type antenna is made.

In the above manufacturing process, by virtue that the Mylar layer having been stuck to the copper foil is stuck further to a layer of adhesive, the copper foil can thus be tightly stuck between the layers of the adhesive and the Mylar, the copper foil and the Mylar layer will not be separated from each other during operation to affect the quality of an antenna.

And in the manufacturing method of the present invention, the releasable film and the Mylar layer are punched with a positioning hole to allow manipulation of an automatized machine on an alignment point during the manufacturing process, this can save consumption of manpower and increase the stability of the relative distance between the Mylar and the copper foil.

Moreover, punching a positioning hole on the product of antenna of the present invention can allow a customer to stick the antenna on the main body of a mobile phone or a mobile electronic device.

The present invention will be apparent in its content of technique after reading the detailed description of the preferred embodiment thereof in reference to the accompanying drawings.

DETAILED DESCRIPTION OF THE PREFERRED EMBODIMENT

Figure 1:
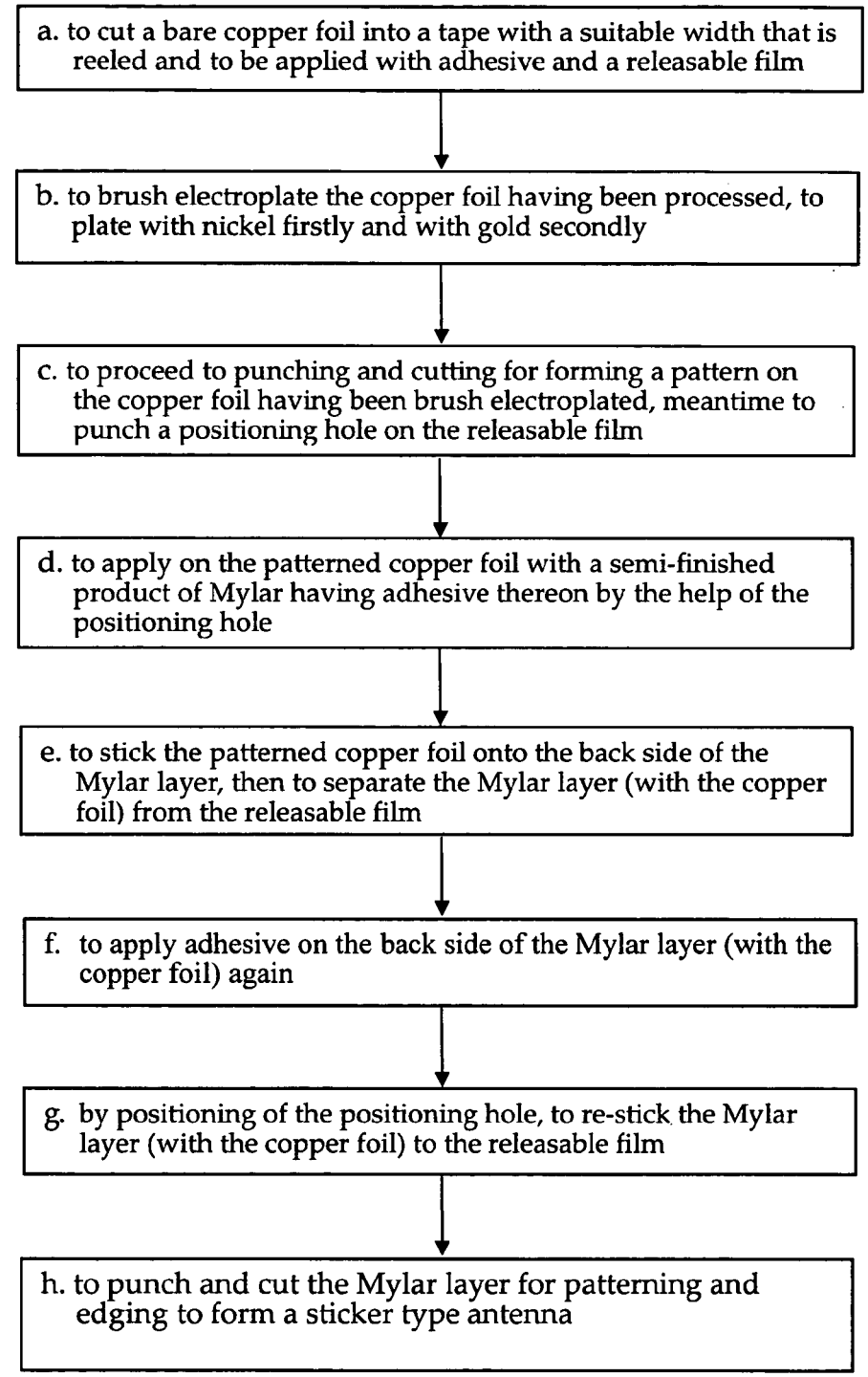
FIG. 1 is a process flowchart of the method of manufacturing a sticker type antenna of the present invention.

Referring firstly to FIG. 1 which is a process flowchart of the method of manufacturing of the present invention, it includes the steps of:

a. to cut a bare copper foil into a tape with a suitable width that is reeled and to be applied with adhesive and a releasable film;

b. to brush electroplate the copper foil having been processed, to plate with nickel firstly and with gold secondly;

c. to proceed to punching and cutting for forming a pattern on the copper foil having been brush electroplated, meantime to punch a positioning hole on the releasable film;

d. to apply on the patterned copper foil with a semi-finished product of Mylar having adhesive thereon by the help of the positioning hole;

e. to stick the patterned copper foil onto the back side of the Mylar layer, then to separate the Mylar layer (with the copper foil) from the releasable film;

f. to apply adhesive on the back side of the Mylar layer (with the copper foil) again; and g. by positioning of the positioning hole, to re-stick the Mylar layer (with the copper foil) to the releasable film;

h. to punch and cut the Mylar layer for patterning and edging to form a sticker type antenna.

Figures 2, 3:
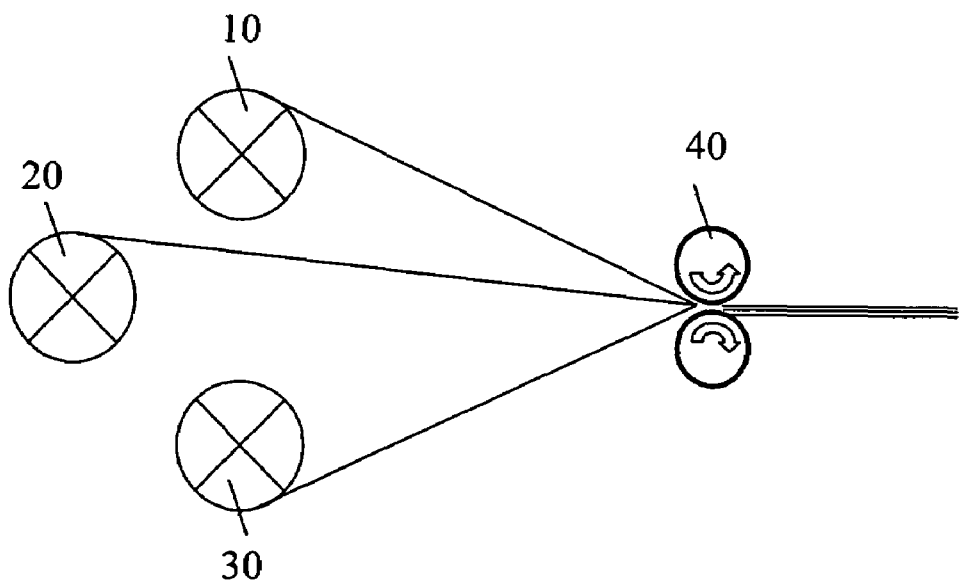
FIG. 2 is a process flowchart in manufacturing a semi-finished product of Mylar.
FIG. 3 is a schematic view showing a manufacturing step "a" of the present invention.

Referring to FIG. 2, the manufacturing process of the semi-finished product of Mylar in the step "d" includes:

A1. to draw a positioning hole on the Mylar layer and the releasable film;

A2. to form the positioning hole by punching and cutting to form the semi-finished product.

In the step "a" of the manufacturing method, by the fact that a bare copper foil is applied to a releasable film, so that the copper foil can bear the pulling force in the brush electroplating process of the next step "b", hence the copper foil can be of normal material rather than specific material (such as the beryllium copper in the prior art). The thickness of the copper foil used presently is 0.017 mm which is much thinner than that of a soft type antenna. FIG. 3 is a schematic view showing the process of step "a", a reel of copper foil 10, a reel of adhesive 20 and a reel of releasable film 30 are reeled out to be pressed together with a pressing cylinder set 40.

Figure 4:
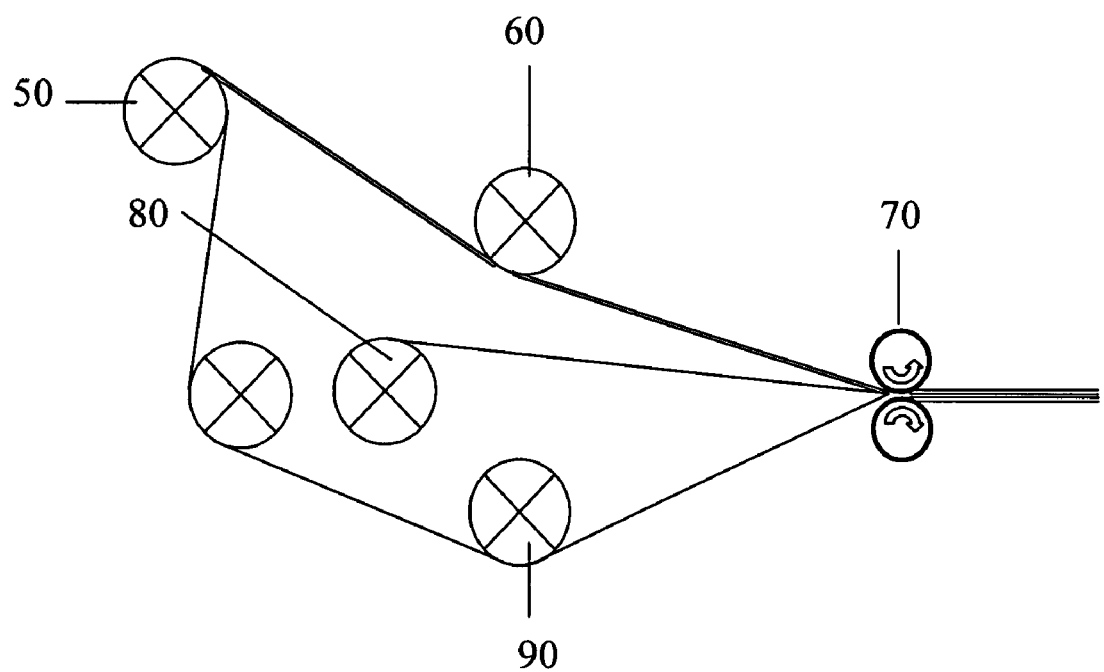
FIG. 4 is a schematic view showing the manufacturing steps "e" to "g" of the present invention.

In the step "f" of the manufacturing method, the Mylar layer with the copper foil is applied with one more layer of adhesive, the copper foil can thus be tightly stuck between the layers of the adhesive and the Mylar, the copper foil and the Mylar layer will not be separated from each other during operation to affect the quality of an antenna. FIG. 4 shows the steps "e" to "g" of the manufacturing method, wherein the copper foil and the Mylar layer and a releasable film 50 pass through a reel of Mylar layer/copper foil 60 and a reel of releasable film 90 to separate the releasable film, then a reel of adhesive 80 is reeled out to give the adhesive to apply to the back side of the Mylar layer (with the copper foil), and a pressing cylinder set 70 is used to press them together.

In the step "g" of the manufacturing method, the releasable film and the Mylar layer are punched with a positioning hole to allow manipulation of an automatized machine on an alignment point during the manufacturing process, this can save consumption of manpower and increase the stability of the relative distance between the Mylar and the copper foil. Further, punching a positioning hole on the product of antenna of the present invention can allow a customer to stick the antenna on the main body of a mobile phone or a mobile electronic device.

According to the processing method disclosed above, the method of manufacturing a sticker type antenna of the present invention makes the antenna thinner and have its cost be largely reduced; the copper foil and the Mylar layer are stuck firm with and are not be separated from each other during operation.

Having thus described the technical structure of my invention, what I claim as new and desire to be secured by Letters Patent of the United States is:

1. A method of manufacturing a sticker type antenna, said method comprising in order steps of:
    a. Cutting a bare copper foil into a tape with a suitable width that is reeled and to be applied with adhesive and a releasable film;
    b. brushing electroplate said copper foil having been processed, to plate with nickel firstly and with gold secondly;
    c. punching and cutting for forming a pattern on said copper foil having been brush electroplated, meantime to punch a positioning hole on said releasable film;
    d. applying on said patterned copper foil with a semi-finished product of a Mylar layer having adhesive thereon by the help of said positioning hole;
    e. sticking said patterned copper foil onto a back side of said Mylar layer, then to separate said Mylar layer with said copper foil from said releasable film;
    f. applying adhesive on said back side of said Mylar layer with said copper foil again;
    g. positioning of said positioning hole, to re-stick said Mylar layer (with said copper) to said releasable film; and
    h. punching and cutting said Mylar layer for patterning and edging to form said sticker type antenna.

2. The method of manufacturing a sticker type antenna as defined in claim 1, wherein manufacturing process of said semi-finished product of Mylar in said step "d" further comprising:
    A1. drawing a positioning hole on said Mylar layer and said releasable film;
    A2. forming said positioning hole by punching and cutting to form said semi-finished product.

3. The method of manufacturing a sticker type antenna as defined in claim 1, wherein thickness if said copper foil is 0.017 mm.

4. The method of manufacturing a sticker type antenna as defined in claim 1, wherein in said step "a" of said manufacturing method, a reel of copper foil, a reel of adhesive and a reel of releasable film are reeled out to be pressed together with a pressing cylinder set.

5. The method of manufacturing a sticker type antenna as defined in claim 1, wherein in said steps "e" to "g" of said manufacturing method, a copper foil, a Mylar layer and a releasable film pass through a reel of Mylar layer/copper foil and a reel of releasable film to separate said releasable film, then a reel of adhesive is reeled out to give said adhesive to apply to said back side of said Mylar layer with said copper foil, and a pressing cylinder set is used to press said adhesive, said back side of said Mylar layer with said copper foil and said releasable film together.

\* \* \* \* \*